(12) United States Patent
Cleveland et al.

(10) Patent No.: US 6,225,852 B1
(45) Date of Patent: May 1, 2001

(54) USE OF BIASED HIGH THRESHOLD VOLTAGE TRANSISTOR TO ELIMINATE STANDBY CURRENT IN LOW VOLTAGE INTEGRATED CIRCUITS

(75) Inventors: Lee Edward Cleveland; Yong Kim, both of Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/411,170

(22) Filed: Oct. 1, 1999

(51) Int. Cl.[7] ........................................... G05F 3/08
(52) U.S. Cl. ........................ 327/534; 327/537; 327/544
(58) Field of Search ................................ 327/534, 535, 327/537, 544, 390, 589

(56) References Cited

U.S. PATENT DOCUMENTS

| | | | | |
|---|---|---|---|---|
| 4,460,835 | * | 7/1984 | Masuoka | 327/536 |
| 5,644,266 | * | 7/1997 | Chen et al. | 327/534 |
| 5,986,443 | * | 11/1999 | Jeong | 327/391 |
| 6,040,610 | * | 3/2000 | Noguchi et al. | 327/143 |
| 6,061,267 | * | 5/2000 | Houston | 365/154 |

OTHER PUBLICATIONS

B.Streetman, Solid State Electronic Devices, Third Edition, 1990, section 8.3.7, pp. 320–322.

* cited by examiner

Primary Examiner—Tuan T. Lam
Assistant Examiner—Terry L. Englund
(74) Attorney, Agent, or Firm—Brinks Hofer Gilson & Lione

(57) ABSTRACT

An integrated circuit (100) includes a first input (108) to receive a first operating voltage Vcc and a second input (110) to receive a second operating voltage Vss. Operating circuitry (102) of the integrated circuit is coupled to the first input to power the operating circuitry. A transistor (104) is coupled between the second input and the operating circuitry to selectively provide the second operating voltage to the operating circuitry of the integrated circuit. The well containing the transistor is biased to provide a reverse body effect and reduce the threshold voltage of the transistor to allow operation at very low Vcc.

8 Claims, 2 Drawing Sheets

USE OF BIASED HIGH THRESHOLD VOLTAGE TRANSISTOR TO ELIMINATE STANDBY CURRENT IN LOW VOLTAGE INTEGRATED CIRCUITS

BACKGROUND OF THE INVENTION

The present invention relates generally to integrated circuit design. More particularly, the present invention relates to circuit design techniques to ensure high-speed, low-power operation at reduced supply voltages in semiconductor memory devices.

In the design of integrated circuits, there is a trend to power the integrated circuits using decreasing supply voltage levels. Previous circuit families operated at 5 volts and 3 volts. Current families operate at 1.8 volts and future families will operate at 1.0 volts nominal supply voltage. Under worst case conditions, the supply voltage may be as low as 0.9 volts. These lower supply voltages create design and operation problems.

One problem is encountered when adapting conventional complementary metal-oxide-semiconductor (CMOS) circuits for low voltage operation. Conventional n-channel and p-channel transistors have threshold voltages (also called turn-on voltages) too large for satisfactory operation in low voltage applications. For example, a conventional p-channel transistor has a threshold voltage of approximately −1.2 volts and a conventional n-channel transistor has a threshold voltage of approximately 1.1 volts. In a 1.0-volt supply device, these conventional transistors will never be turned fully on to sink or source current to a load.

One solution is lowering the threshold voltage of the transistors. With the magnitude of the p-channel and n-channel threshold voltages set at −0.4 volts and 0.6 volts, respectively, the transistors can turn on fully even at worst case supply voltages. This is important to device performance, since the drain current IDS is proportional to the square of the difference between the drain to source voltage VDS and the threshold voltage Vt. However, transistors with low threshold voltages tend to have higher subthreshold current leakage. In a large integrated circuit with thousands or millions of transistors, the total standby current would be too large for practical applications. The large standby current would increase overall power consumption for the device to unacceptable levels.

Accordingly there is a need for an improved method and apparatus for reducing standby current in an integrated circuit, particularly an integrated circuit employing reduced-threshold voltage transistors in a low supply voltage application.

BRIEF SUMMARY

By way of introduction only, an integrated circuit in accordance with the present invention disconnects Vss or ground potential from the operating circuitry of the integrated circuit in the standby mode. Vss is received from off-chip and is supplied to the entire chip through a very large reduced-threshold voltage transistor. In the active mode, the well of the transistor is boosted by a predetermined voltage to lower the threshold voltage of the transistor for operation at low Vcc. In the standby mode, the gate and well of the transistor are grounded to the off-chip Vss, turning off the transistor and letting voltage of the operating circuitry float. This allows very quick turn on from standby to the active mode.

The foregoing discussion of the preferred embodiments has been provided only by way of introduction. Nothing in this section should be taken as a limitation on the following claims, which define the scope of the invention.

DETAILED DESCRIPTION OF THE PRESENTLY PREFERRED EMBODIMENTS

Figure 1:
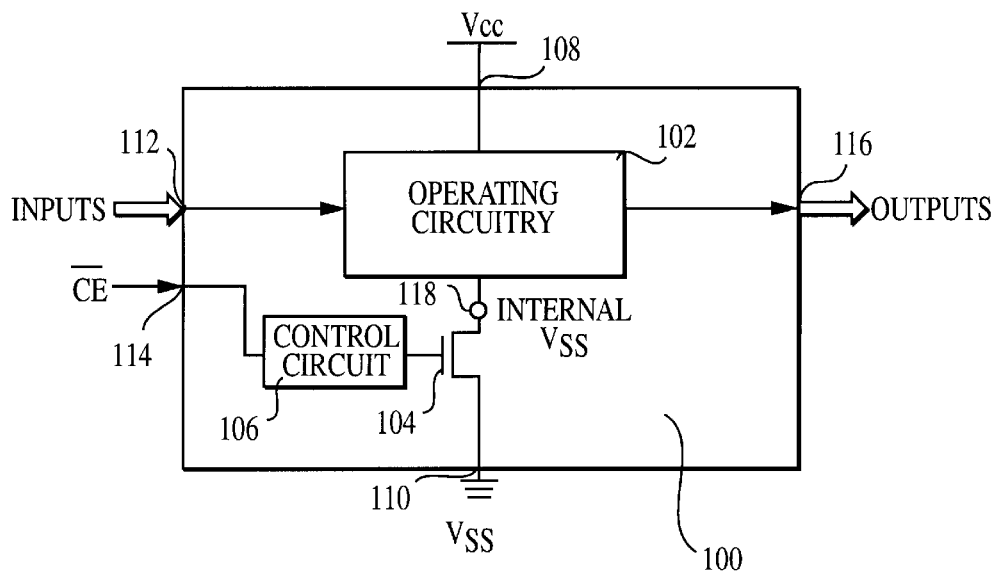
FIG. 1 is a block diagram of an integrated circuit.

Referring now to the drawing, FIG. 1 is a block diagram of an integrated circuit 100. The integrated circuit 100 may be any integrated circuit manufactured in any suitable technology. In the illustrated embodiment, the integrated circuit 100 is a flash memory chip fabricated using a complementary metal-oxidesemiconductor (CMOS) manufacturing process adapted to low voltage operation. By low voltage, it is meant that the integrated circuit 100 is designed to operate at a very low supply voltage, the supply voltage being defined as the potential difference between a supply voltage level and ground. In the exemplary embodiment, the supply voltage labeled Vcc is nominally 1.0 volts +/−0.1 volts. Further, the supply voltage labeled Vss is nominally ground or zero volts.

The integrated circuit 100 includes operating circuitry 102, a transistor 104, a control circuit 106, a first input 108 configured to receive a first operating voltage, namely the supply voltage Vcc, and a second input 110 configured to receive a second operating voltage, namely Vss or ground. Further, the integrated circuit 100 has inputs 112, an enable input 114 and outputs 116. The operating circuitry 102 performs the operational functions of the integrated circuit 100. For example, in the illustrated embodiment of a memory chip, the operating circuitry 102 includes such structure as a core cell array for storing data, an x-decoder and a y-decoder for uniquely selecting data storage locations in the core cell array, programming circuitry for storing data in the core cell array and other operational circuitry. Address data are received at the inputs 112 and data is provided at outputs 116. In other embodiments, the operating circuitry 102 will include other circuitry required to perform the necessary function of the integrated circuit 100.

The transistor 104 is coupled between the second input 110 and the operating circuitry 102 for selectively providing the second operating voltage, Vss, to the operating circuitry of the integrated circuit. The second supply voltage at the input 110 is typically the most negative voltage in the circuit including the integrated circuit 100. The integrated circuit 100 is powered by the potential difference between the first operating voltage, Vcc, at the input 108 and the second operating voltage, Vss, at the input 110. While these voltages may be any suitable value, typical values used in the exemplary embodiment of FIG. 1 are Vcc=1.0 volts and Vss=ground or zero volts. The input 108 and the input 110 may be, for example, a bonding pad of the integrated circuit 100 or a pin or other electrical contact of the package containing the integrated circuit 100.

The transistor 104 is preferably an n-channel transistor which has a source coupled to the input 110, a gate coupled to the control circuit 106 and a drain coupled to an internal supply node 118. The internal node 1 18 is the node which conveys ground or Vss potential to the operating circuitry 102 of the integrated circuit 100. Thus, aside from the transistor 104 and the control circuit 106, all circuitry on the integrated circuit 100 receives ground potential on the internal supply node 118. All circuitry on the integrated circuit 100, including the operating circuitry 102, the control circuit 106 and the transistor 104, receive Vcc from the input 108.

The transistor 104 thus supplies Vss to the entire integrated circuit 100. Structural details for one embodiment of the transistor 104 will be described in greater detail in connection with FIG. 3 below.

The control circuit 106 is coupled between the enable input 114 and the gate of the transistor 104 for selecting one of an active mode and a standby mode in response to the enable signal received at the enable input 114. In the embodiment of FIG. 1, the enable signal supplied to the input 114 is an active low chip enable signal provided to the integrated circuit 100. Memories and other types of integrated circuits include chip enable circuits for placing the integrated circuit in an active or standby mode. In the standby mode, the integrated circuit enters a low power state in which power dissipation is reduced. When the chip enable signal is asserted by applying a logic low voltage at the input 114 and possibly other inputs, the integrated circuit 100 enters active mode in which the operating circuitry 102 is powered and operational. Preferably, the control circuit 106 is controlled by the chip enable signal received at the input 114. The input 114 thus forms an enable means for receiving an enable signal, the enable signal defining an active mode and a standby mode. However, in other embodiments, the enable signal may be provided by another functional input of the integrated circuit 100 or by a portion of the operating circuitry 102 or some other circuitry controlled independently of the transistor 104. The control circuit 106, in response to the enable signal, operates to control the gate of the transistor 104.

Figure 2:
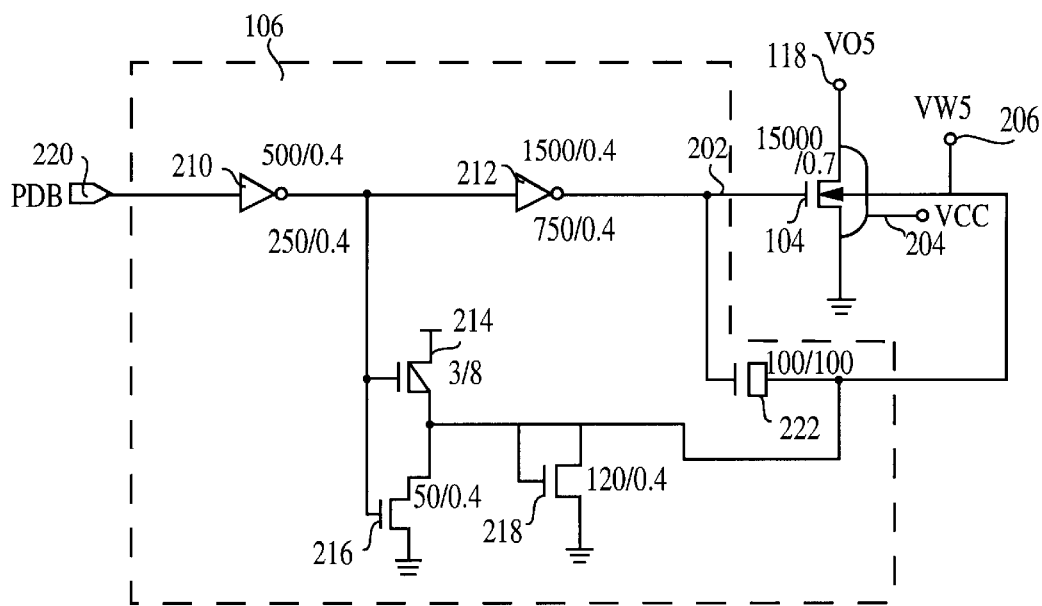
FIG. 2 is a schematic diagram of a portion of the integrated circuit of FIG. 1.

FIG. 2 is a schematic diagram of the control circuit 106 shown in conjunction with the transistor 104 of the integrated circuit 100 (FIG. 1). In FIG. 2, relative transistor sizes are illustrated in units of micrometers. The sizes have been found to be suitable for devices manufactured according to one particular CMOS processing technology. Other device sizes and circuit configurations may be substituted to perform similar functions.

In FIG. 2, the transistor 104 is shown in greater detail. The transistor 104 is an n-channel MOS transistor having a source tied to Vss or ground, a gate tied to an internal node 202 and a drain tied to the internal Vss node 118, labeled V05 in FIG. 2. The transistor 104 further includes an n-well connection 204 coupled to Vcc and a p-well connection 206, labeled VW5 in FIG. 2. Preferably, the transistor 104 is a very large transistor capable of sourcing a substantial current. In the illustrated embodiment, the gate length of the transistor 104 is 0.7 microns while the gate width of the transistor is 15,000 microns. In this example, the size of the transistor 104 is preferably chosen to ensure a current sinking capability of 20 milliamps with only 100 millivolts drop between the drain and source of the transistor 104. Under these conditions, the voltage on the internal supply node 118 will never exceed 100 millivolts above Vss or ground. In other applications, other current sinking capabilities or voltage drops from Vss may be chosen. In general, making the transistor 104 larger allows it to sink larger current at lesser voltage drop.

The control circuit 106 includes an inverter 210, an inverter 212, a transistor 214, a transistor 216 and a transistor 218. The inverter 210 receives the enable signal from an input 220. Input 220 may be, coupled to any suitable circuitry within the integrated circuit 100, such as the enable input 114 (FIG. 1). Preferably, the enable signal received at the input 220 has conventional digital logic levels, approximately equal to Vcc and Vss in a CMOS system. The inverter 212 has an input coupled to the output of the inverter 210 and an output coupled to the node 202 which is common with the gate of the transistor 104.

The transistor 214 is a reduced-threshold p-channel transistor. The transistor 214 has a source coupled to Vcc, a gate coupled to the output of the inverter 210 and a drain coupled to node 206. The transistor 214 is fabricated to have a relatively low threshold voltage. This is indicated by the diagonal line through the symbol for the transistor 214. In the embodiment of FIG. 2, the transistor 214 is a p-channel transistor fabricated to have a nominal threshold voltage of approximately −0.4 volts. This design parameter may be achieved by any suitable technique, such as by omitting the channel implant during fabrication of the transistor 104 (i.e., forming an intrinsic transistor), or by reducing the thickness of the gate oxide of the transistor 214. The threshold voltage for the transistor 214 differs from threshold voltages for other transistors used, for example, in the operating circuitry 102 of the integrated circuit 100. For conventional logic functions and for memory cell devices, p-channel transistors will typically have a threshold voltage of approximately −1.2 volts. The low threshold voltage of the transistor 214 is particularly well suited to applications involving low supply voltage, such as a supply voltage of 1.0 volts.

The transistor 216 is an n-channel transistor having a conventional threshold voltage. The transistor 216 has a drain coupled to node 206, a gate coupled to the output of the inverter 210 and a source coupled to Vss or ground. The threshold voltage of the transistor 216 is approximately 1.0 volts under nominal conditions.

The transistor 218 is diode-connected between the node 206 and Vss. The transistor 218 is an N-channel transistor having a normal threshold voltage. The drain and gate of the transistor 218 are coupled to node 206 and the source of the transistor 218 is coupled to Vss. The capacitor 222 is a conventional MOS field capacitor formed by depositing a gate on field oxide adjacent to a source/drain region. The gate side of the capacitor 222 is coupled with the gate of the transistor 104 at node 202. The source/drain side of the capacitor 222 is coupled with the p-well of the transistor 104 at node 206. When the voltage at the gate of the capacitor is raised to Vcc, the capacitor boosts the voltage on the source/drain side of the capacitor 222, increasing the bias voltage on the p-well of the transistor 104. Thus, the capacitor 222 is coupled between a gate of the transistor 104 and a well containing the transistor 104 for applying a substrate bias to the transistor 104 to reduce threshold voltage of the transistor in the active mode of the integrated circuit.

In the active mode, an enable signal is asserted at the input 220. For active mode, the enable signal is a logic high signal, approximately Vcc or 1.0 volts. The inverter 210 inverts this signal and produces a logic low value at its output, approximately Vss or zero volts. The inverter 212 in turn inverts the signal from the output of the inverter 210, producing a logic high signal at the output of the inverter 212. This high voltage is applied to the gate of the transistor 104 and the gate of the capacitor 222. Preferably, the pull-up device of the inverter 212 has sufficient current drive to rapidly charge up the capacitor 222 and the gate capacitance of the transistor 104. In the exemplary embodiment of FIG. 2, the inverter 212 includes a p-channel transistor 1500 microns wide to provide the necessary current drive.

The low voltage at the output of the inverter 210 turns on the p-channel transistor 214. This transistor is sized to operate as a weak pull-up path to replenish any boosted charge that leaks away from the node 206.

In response to the high voltage applied by the inverter 212 on the gate of the capacitor 222, the source/drain side of the capacitor 222 is boosted to an elevated voltage. Preferably, the p-well of the transistor 104, at node 206, is boosted to a level of approximately 200 mV to 400 mV above Vcc. This boosting of the p-well of the n-channel transistor 104 operates to create a reverse body effect. This is also referred to as a substrate bias effect. As is well known, by varying the substrate bias on a transistor, the threshold voltage can be raised or lowered. Typically, the threshold voltage varies by a 0.8 to 1 ratio with boosted voltage. Thus, a 100 mV boost in the well voltage reduced the threshold voltage by approximately 80 mV.

In the illustrated embodiment, the substrate or p-well node 206 is boosted by a few hundred millivolts to reduce the threshold voltage of the transistor 104. Reducing the threshold voltage of the transistor 104 improves operation at low Vcc, such as in systems where the supply voltage Vcc is only 1.0 volt. Reducing the threshold voltage of the transistor 104 reduces sub-threshold leakage current, which is an exponential function of the threshold voltage.

The diode-connected transistor 218 operates as a clamp to limit how high the voltage on node 206, the p-well of the transistor 104, can rise. If the voltage on node 206 rises above the threshold voltage of the transistor 218, transistor 218 will turn on, limiting the voltage on node 206.

In the transition from active mode to standby mode, the enable signal on the input 220 goes from high voltage to low voltage. The inverter 210 produces a high voltage at its output which is inverted by the inverter 212 to produce a low voltage on node 202, the gate of the transistor 104 and the capacitor 222. This turns off the transistor 104. Preferably, the pull-down transistor of the inverter 212 is sized sufficiently large to rapidly discharge node 202.

The high voltage at the output of the inverter 210 turns on transistor 216. This transistor 216 rapidly discharges the capacitor 222, as well as the capacitance between the P-well node 206 and the N-well node 204.

Figure 3:
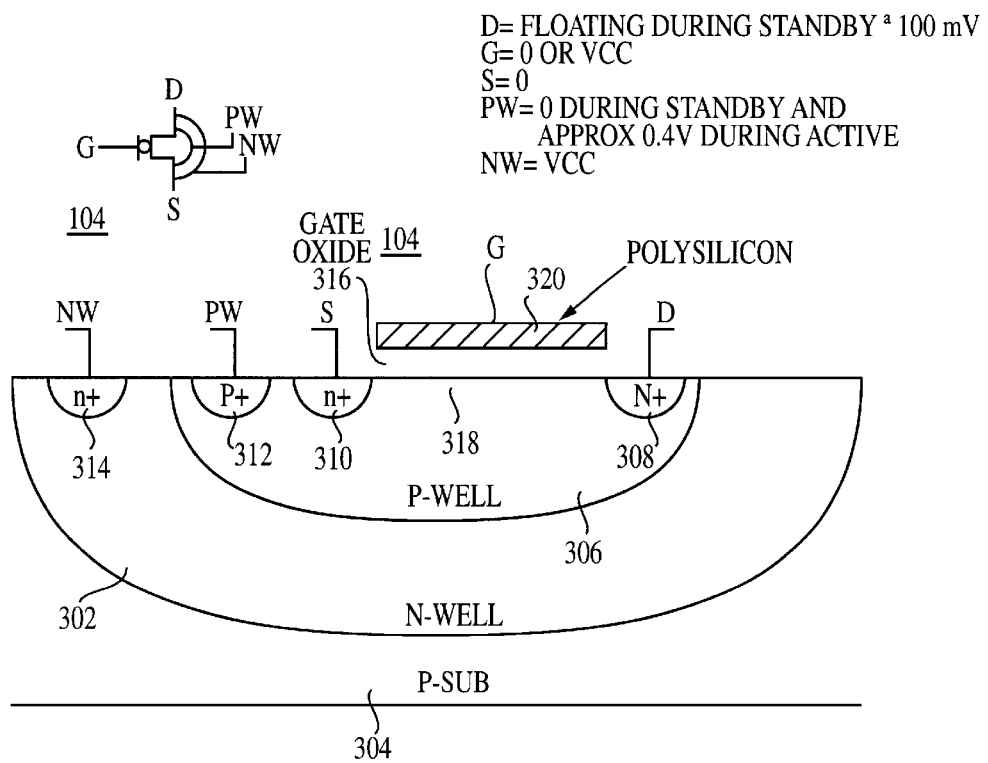
FIG. 3 is a cross section view of a transistor of the circuit of FIG. 2.

FIG. 3 illustrates in both schematic form and in cross-section the transistor 104. As can be seen in FIG. 3, the transistor 104 includes an n-well region 302 formed in a p-type substrate 304. A p-well 306 is formed in the n-well 302. To provide source and drain regions for the transistor 104, a first n+ region 308 is formed and a second n+ region 310 is formed in the p-well 306. To provide a good electrical contact to the p-well, a p+ region 312 is formed in the p-well 306. Similarly, to provide good electrical contact, a n+ region 314 is formed in the n-well 302. Gate oxide 316 is grown above a channel region 318 of the transistor 104. A polysilicon gate 320 is formed on top of gate oxide 316.

The structure of the transistor 104 can be formed using any suitable conventional semi-conductor processing techniques. Additionally, metal or polysilicon contacts may be made to the semiconductor regions shown in FIG. 3 in order to form the illustrated electrical terminals.

As noted in FIG. 3, a drain node labeled D is either floating during standby mode or is coupled to the internal Vss node with a value approximately 100 millivolts above Vss. The gate, labelled G, is driven to either Vss (zero volts) or Vcc, depending upon the operating mode. The source or S is coupled directly to external Vss for the integrated circuit, including the transistor 104. The p-well or PW is tied to zero volts or Vss during standby mode and boosted to a range of approximately 0.25 or 0.4 volts during active mode. The n-well or NW is tied to Vcc.

Significantly, the transistor 104 is an intrinsic transistor. That is, no channel implant is provided during fabrication. A channel implant is conventionally used to set the n-channel threshold voltage at approximate 1.0 volts. With no channel implant, the threshold voltage of the n-channel transistor 104 is nominally equal to approximately 0.6 volts, which is reduced from the conventional threshold voltage value for n-channel transistors. In the active mode, when the voltage on the p-well is boosted to approximately 0.4 volts, due to the substrate bias effect the threshold voltage of the transistor 104 is reduced even further. Thus, the transistor 104 turns on very rapidly and very strongly in the standby mode and the drain-to-source voltage is limited to about 100 mV. The internal Vss voltage at the drain of the transistor 104 is only about 100 millivolts above the external Vss of the integrated circuit at the source of the transistor 104. The reduced threshold voltage allows faster operation as the transistor 104 switches more rapidly with a reduced Vt. Boosting the well voltage lowers the threshold voltage.

Figure 4:
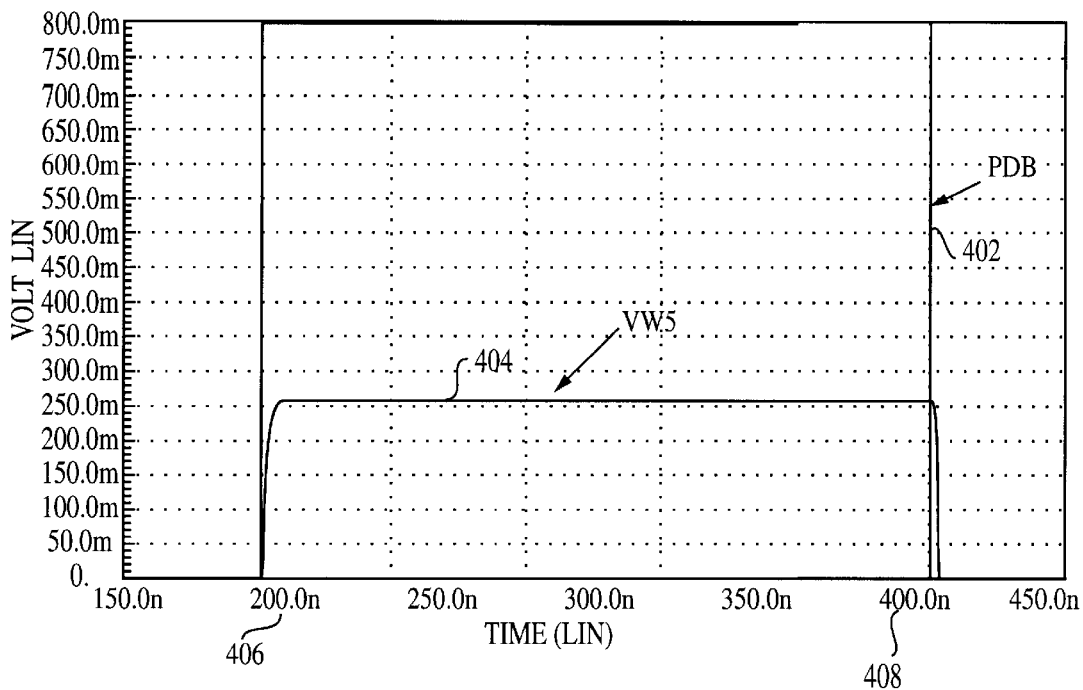
FIG. 4 is a timing diagram illustrating operation of the circuit of FIG. 2.

FIG. 4 shows a timing diagram illustrating operation of the control circuit 106 of FIG. 2. In the timing diagram, voltages on two nodes are plotted. The trace labeled 402 corresponds to the voltage on the enable input 220, labeled PDB. The voltage on the trace 404 corresponds to the voltage on the P-well, node 206, labeled VW5. At an initial time 406, the enable signal PDB is driven to a logic high level, 0.8 volts. In response, the voltage on the P-well VW5, node 206 in FIG. 2, is boosted to an elevated level, approximately 0.25 volts. At a later time 408, the PDB enable signal is de-asserted and the voltage VW5 on node 206 returns to zero volts, corresponding to the standby mode. As can be seen in FIG. 4, turn on and turn off of the well biasing circuit of FIG. 2 are very rapid, ensuring rapid entry and exit from the active mode.

From the foregoing, it can be seen that the present invention provides an improved circuit and method for eliminating standby current in low voltage integrated circuits. A very large intrinsic transistor supplies Vss to the entire chip. The gate of the transistor is controlled by an enable signal to control standby and active modes. During standby, the gate and p-well of the transistor are grounded. When the enable signal goes high, the intrinsic transistor's gate is driven high and the well is boosted to an elevated voltage. This reduces the threshold voltage of the transistor to allow low Vcc operation.

While a particular embodiment of the present invention has been shown and described, modifications may be made. It is therefore intended in the appended claims to cover all such changes and modifications which fall within the true spirit and scope of the invention.

What is claimed is:

1. An integrated circuit comprising:
   a first input configured to receive a first operating voltage;
   a second input configured to receive a second operating voltage;
   operating circuitry coupled to the first input;
   a transistor coupled between the second input and the operating circuitry for selectively providing the second operating voltage to the operating circuitry of the integrated circuit;
   a capacitor coupled between a gate of the transistor and a well containing the transistor for applying a substrate bias to the transistor to reduce a threshold voltage of the transistor in an active mode of the integrated circuit; and a reset transistor coupled to the well and configured to remove the substrate bias in a standby mode of the integrated circuit.

2. The integrated circuit of claim 1 further comprising:

an enable input configured to receive an enable signal, the enable input being coupled to the gate of the transistor to turn on the transistor in the active mode and turn off the transistor in the standby mode.

3. The integrated circuit of claim 1 further comprising:

an enable input configured to receive an enable signal; and a control circuit coupled between the enable input and the gate of the transistor for selecting one of the active mode and the standby mode in response to the enable signal.

4. A method for reducing standby current in an integrated circuit, the method comprising:

(a) receiving an operating voltage at an input of the integrated circuit;

(b) in an active mode, providing the operating voltage to all operating circuitry of the integrated circuit through a transistor, including applying a bias voltage to a well containing the transistor to reduce threshold voltage of the transistor in the active mode; and (c) in a standby mode, disabling the transistor to isolate the operating circuitry of the integrated circuit from the operating voltage, including removing the bias voltage in the standby mode.

5. The method of claim 4 wherein act (b) comprises the act of:

storing charge on a capacitor to boost voltage of the well to the bias voltage.

6. The method of claim 4 further comprising the act of:

receiving a second operating voltage at a second input of the integrated circuit, the potential difference between the second operating voltage and the operating voltage being approximately 1 volt.

7. An integrated circuit operable at reduced supply voltage, the integrated circuit comprising:

operating circuitry operative in response to a potential difference between a first operating voltage and a second operating voltage, the potential difference defining the supply voltage;

an input for receiving the first operating voltage;

a second input for receiving the second operating voltage;

enable means for receiving an enable signal, the enable signal defining an active mode and a standby mode;

a transistor coupled to the enable means, the operating circuitry and the second input, the transistor turning on in the active mode to provide the second operating voltage to the operating circuitry and turning off in the standby mode to remove the second operating voltage from the operating circuitry;

a capacitor selectively coupled to the transistor for raising a bias voltage of the transistor to reduce a threshold voltage of the transistor; and a reset transistor for discharging the capacitor in the standby mode.

8. The integrated circuit of claim 7 wherein the operative circuitry receives input signals of the integrated circuit.

* * * * *